US008802356B2

(12) United States Patent
Yun et al.

(10) Patent No.: US 8,802,356 B2
(45) Date of Patent: Aug. 12, 2014

(54) PHOTOSENSITIVE FILM PATTERN AND METHOD FOR MANUFACTURING A PHOTOSENSITIVE FILM PATTERN

(75) Inventors: Sang Hyun Yun, Suwon-si (KR); Cha-Dong Kim, Hwaseong-si (KR); Jung-In Park, Seoul (KR); Hi Kuk Lee, Yongin-si (KR); Su-Yeon Sim, Changwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 159 days.

(21) Appl. No.: 13/309,679

(22) Filed: Dec. 2, 2011

(65) Prior Publication Data
US 2012/0301684 A1  Nov. 29, 2012

(30) Foreign Application Priority Data

May 24, 2011 (KR) .......................... 10-2011-0049110

(51) Int. Cl.
 *G03F 7/00* (2006.01)
(52) U.S. Cl.
 USPC ............................................. 430/311; 430/325
(58) Field of Classification Search
 USPC .......................................... 430/311, 321, 325
 See application file for complete search history.

(56) References Cited

U.S. PATENT DOCUMENTS

| 5,991,006 A | 11/1999 | Tsudaka |
| 6,379,867 B1 * | 4/2002 | Mei et al. ....................... 430/296 |
| 2005/0106473 A1 * | 5/2005 | Huang ............................... 430/5 |
| 2008/0079923 A1 * | 4/2008 | Latypov et al. ................. 355/71 |

FOREIGN PATENT DOCUMENTS

| JP | 09-258425 | 10/1997 |
| JP | 2003-255508 | 9/2003 |
| JP | 2008-096760 | 4/2008 |
| JP | 2008-209636 | 9/2008 |
| JP | 2010-122526 | 6/2010 |
| KR | 10-1998-033229 | 7/1998 |
| KR | 10-2005-0069506 | 7/2005 |
| KR | 10-2006-0025894 | 3/2006 |

* cited by examiner

*Primary Examiner* — Stewart Fraser
(74) *Attorney, Agent, or Firm* — H.C. Park & Associates, PLC

(57) ABSTRACT

A method for manufacturing a photosensitive film pattern includes: forming a thin film on a substrate; forming a photosensitive film on the thin film; arranging an exposure apparatus including a photo-modulation element on the photosensitive film; exposing the photosensitive film using the exposure apparatus according to an exposure pattern of the photo-modulation element; and developing the exposed photosensitive film to form a photosensitive film pattern. The exposure pattern includes a main pattern of a quadrangular shape and a at least one assistance pattern positioned at a corner of the main pattern. The photosensitive film pattern has a quadrangular shape with a long edge and a short edge, and a corner with a curved surface having a curvature radius of 20% to 40% of a length of the short edge.

7 Claims, 4 Drawing Sheets

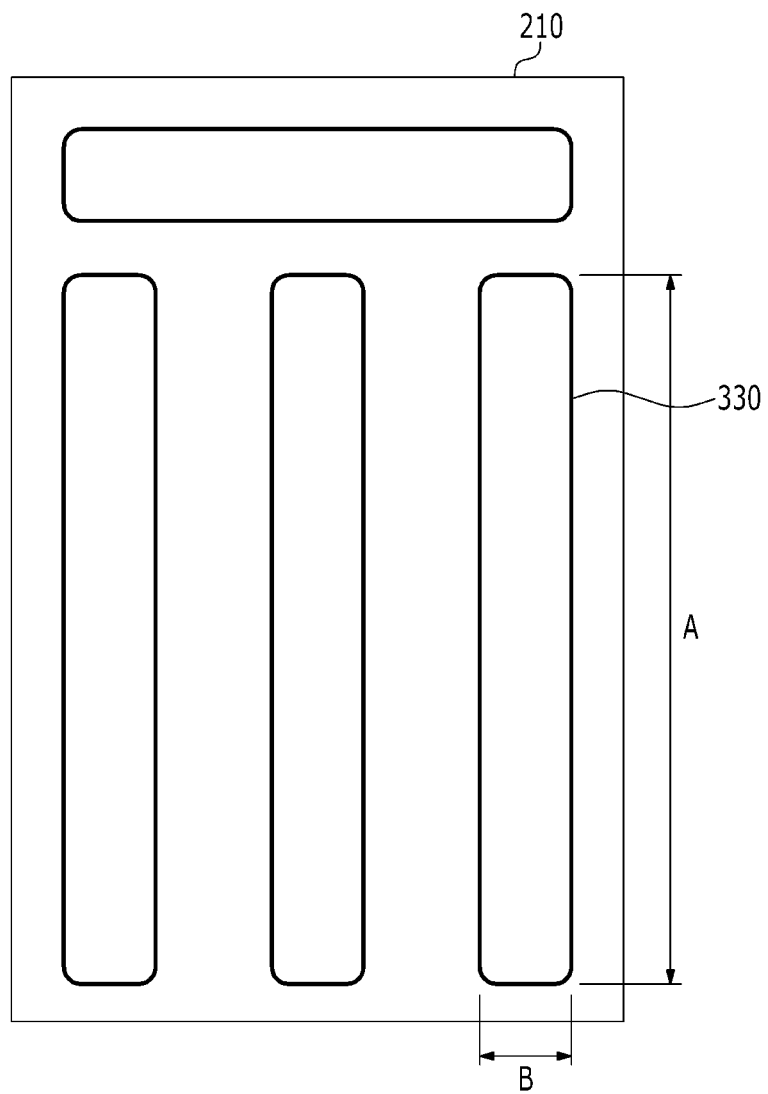

PHOTOSENSITIVE FILM PATTERN AND METHOD FOR MANUFACTURING A PHOTOSENSITIVE FILM PATTERN

CROSS-REFERENCE TO RELATED APPLICATION

This application claims priority from and the benefit of Korean Patent Application No. 10-2011-0049110 filed on May 24, 2011, which is incorporated by reference for all purposes as if fully set forth herein.

BACKGROUND

1. Field

The present disclosure relates to a photosensitive film pattern and a method for manufacturing a photosensitive film pattern.

2. Discussion of the Background

In general, a circuit pattern is formed on a base substrate, such as an insulation substrate or an organic substrate of a display device such as a liquid crystal display, a semiconductor wafer, or a printed circuit board (PCB). To form the circuit pattern, photolithography may be used.

According to the photolithography, a thin film for the circuit pattern is formed on the base substrate, a photosensitive film is formed on the thin film, and the photosensitive film is exposed by using a photomask including a transcribing pattern corresponding to the circuit pattern. Because the photomask includes a transcribing pattern corresponding to the circuit pattern, the photomask may be very accurately manufactured.

If the size of a display device's screen increases, which has recently occurred in the commercial marketplace, the size of the photomask increases. Increasing the size of the photomask creates an additional challenge to maintain precision and reasonable manufacturing costs of the larger-sized photomask.

Accordingly, methods for reducing the number of photomasks and exposing a photosensitive film without a photomask have been researched.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present invention provide a method for manufacturing a photosensitive film pattern where the method may not require a mask. Exemplary embodiments of the present invention also provide a photosensitive film pattern formed without a mask. Exemplary embodiments of the present invention also provide an exposure apparatus having a photo-modulation element to modulate light from a light source according to an exposure pattern.

Additional features of the invention will be set forth in the description which follows, and in part will be apparent from the description, or may be learned by practice of the invention.

An exemplary embodiment of the present invention discloses a method for manufacturing a photosensitive film pattern, including: forming a thin film on a substrate; forming a photosensitive film on the thin film; arranging an exposure apparatus including a photo-modulation element on the photosensitive film; exposing the photosensitive film according to an exposure pattern of the photo-modulation element by using the exposure apparatus; and developing the exposed photosensitive film to form the photosensitive film pattern. The exposure pattern includes a main pattern having a quadrangular shape and a long edge and a short edge, and a first assistance pattern positioned at a first corner of the main pattern.

An exemplary embodiment of the present invention discloses a photosensitive film pattern, including a quadrangular shape including a long edge and a short edge, and a first corner comprising a curved surface having a curvature radius of 20% to 40% of a length of the short edge.

An exemplary embodiment of the present invention discloses an exposure apparatus, including a light source, a photo-modulation element to modulate light from the light source according to an exposure pattern, and a lens unit to transmit the light modulated by the photo-modulation element. The exposure pattern includes a main pattern having a quadrangular shape and a long edge and a short edge, and a first assistance pattern positioned at a first corner of the main pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 4 is a plan view of a photosensitive film pattern on a thin film according to an exemplary embodiment of the present invention.

DETAILED DESCRIPTION OF THE ILLUSTRATED EMBODIMENTS

Figure 1:
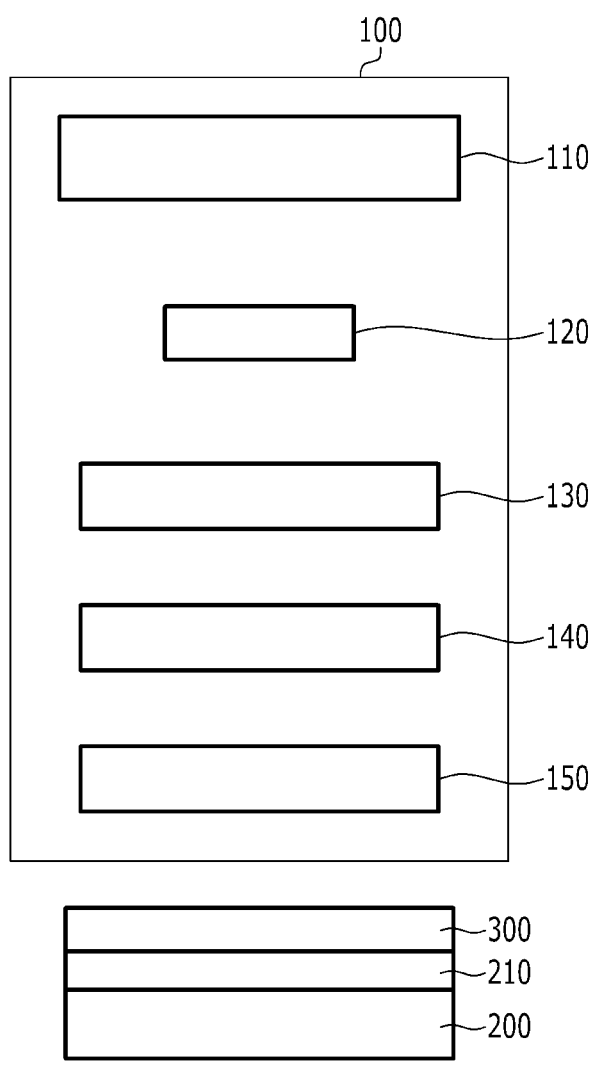
FIG. 1 is a view schematically showing a method for forming a photosensitive film pattern according to an exemplary embodiment of the present invention.

Exemplary embodiments now will be described more fully hereinafter with reference to the accompanying drawings, in which exemplary embodiments are shown. The present disclosure may, however, be embodied in many different forms and should not be construed as limited to the exemplary embodiments set forth therein. Rather, these exemplary embodiments are provided so that the present disclosure will be thorough and complete, and will fully convey the scope of the present disclosure to those skilled in the art. In the description, details of well-known features and techniques may be omitted to avoid unnecessarily obscuring the presented embodiments.

In the drawings, the thickness of layers, films, panels, regions, etc., may be exaggerated for clarity. Like reference numerals designate like elements throughout the specification. It will be understood that when an element such as a layer, film, region, or substrate is referred to as being "on"

another element, it can be directly on the other element or intervening elements may also be present. In contrast, when an element is referred to as being "directly on" another element, there are no intervening elements present.

FIG. 1 is a view schematically showing a method for forming a photosensitive film pattern according to an exemplary embodiment of the present invention.

As shown in FIG. 1, after a thin film 210 for an insulating layer or a metal layer is formed on or directly on a substrate 200, a photosensitive film 300 is formed on or directly on the thin film 210, an exposure apparatus 100 is aligned on the photosensitive film 300, and then the photosensitive film 300 is exposed.

The exposure apparatus 100 includes a light source 110 to provide light, a photo-modulation element 120 to modulate the light provided from the light source 110 according to an exposure pattern, a first lens unit 130 to transmit the light modulated by the photo-modulation element 120 to the photosensitive film 300, a microlens array 140, and a second lens unit 150.

The light source 100 may be an ultraviolet ray lamp or laser.

The photo-modulation element 120 uses a digital microminor device (DMD). The photo-modulation element 120 reflects light supplied from the light source 110 according to the input exposure pattern in a direction and serves as a photomask. The direction may be a reference direction or predetermined direction.

The photo-modulation element 120 may use a 2D grating light valve (GLV), an electric optical element using a lead zirconate titanate (PLZT) as a light transmission ceramic, or a ferroelectric liquid crystal (FLC).

The first lens unit 130 transmits the light modulated by the photo-modulation element 120 to the micro lens array 140. Here, quadrangular light is changed to circular or oval by the microlens array 140. The second lens unit 150 irradiates or allows the circular or oval light to pass through to the photosensitive film 300.

A pattern that will be exposed to the photosensitive film 300 is previously input to or stored in the photo-modulation element 120 as data information. The pattern is described in more detail with reference to FIG. 2.

Figure 2:
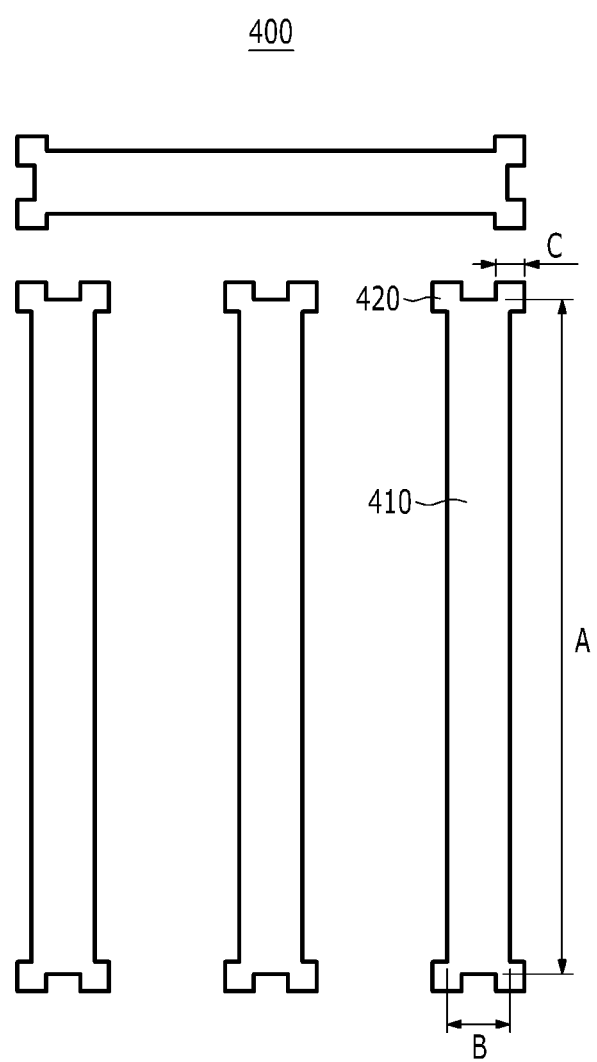
FIG. 2 is a plan view of an exposure pattern that is input to an exposure apparatus according to an exemplary embodiment of the present invention.

FIG. 2 is a plan view of an exposure pattern that is input to an exposure apparatus according to an exemplary embodiment of the present invention As shown in FIG. 2, an exposure pattern 400 includes a main pattern 410 and an assistance pattern 420. The main pattern 410 is quadrangular and includes a pair of long edges A and a pair of short edges B, and the assistance pattern 420 is positioned at each corner of the main pattern 410.

The assistance pattern 420 is square, and a portion thereof overlaps the main pattern 410. The length of one edge C of the assistance pattern 420 may be 20% to 30% of the length of the short edge B of the main pattern 410.

Thus, a portion of an assistance pattern 420 overlaps the long edge A and the short edge B of the main pattern 410 at each corner of the main pattern 410 by 10% to 20% of the length of the short edge B of the main pattern 410.

The main pattern 410 of the exposure pattern 400 includes a pair of long edges A and a pair of short edges B, however the shapes and side lengths of the main pattern 410 of the exposure pattern 400 and the shape of the assistance pattern 420 may vary.

Figure 3:
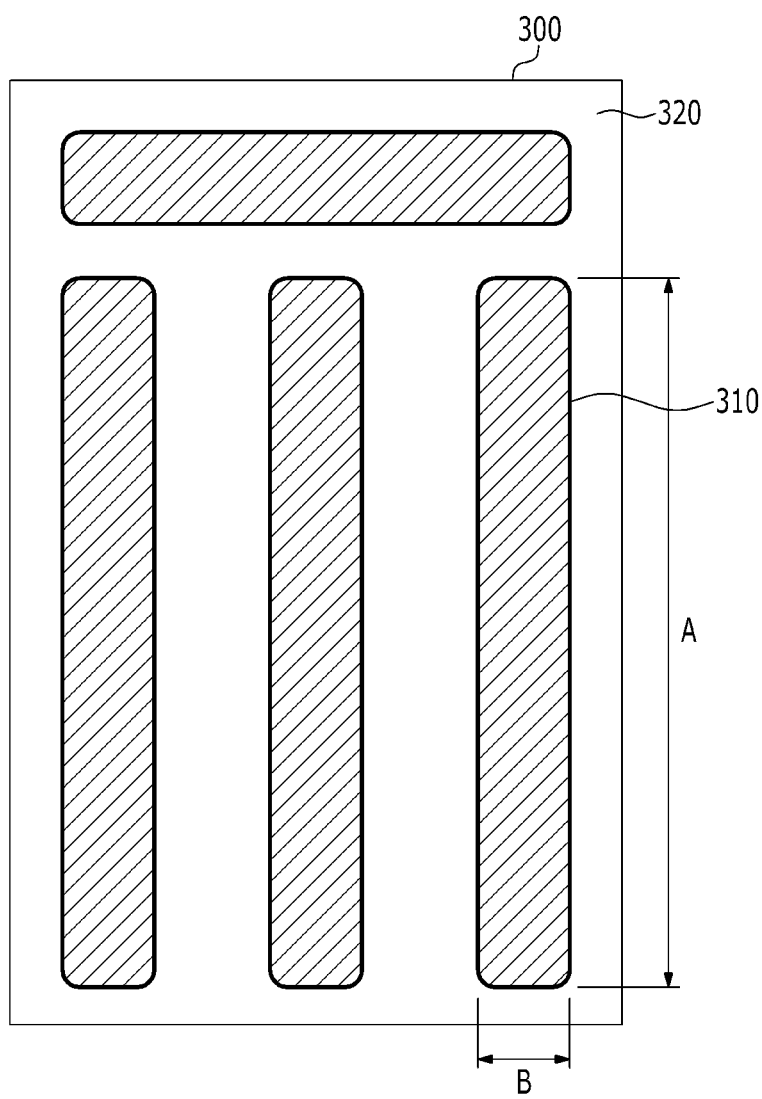
FIG. 3 is a plan view of a photosensitive film that has been exposed to an exposure pattern that is input to an exposure apparatus according to an exemplary embodiment of the present invention.

FIG. 3 is a plan view of a photosensitive film that has been exposed to an exposure pattern that is input to an exposure apparatus according to an exemplary embodiment of the present invention.

As shown in FIG. 3, the photosensitive film 300 includes an exposure region 310 and a non-exposed region 320. The exposure region 310 of the photosensitive film 300 is quadrangular and includes a pair of long edges A and a pair of short edges B. As shown, each corner of the exposure region 310 has a curved surface shape. The curved surface shape may have a curvature, with a curvature radius of 20% to 40% of the length of the short edge B.

Comparing the photosensitive film 300 and the exposure pattern 400, the exposure region 310 of the photosensitive film 300 does not have a square region corresponding to the square shape of the assistance pattern 420 of the exposure pattern 400. This is because the assistance pattern 420 compensates at each corner of the main pattern 410.

As described above, the photosensitive film 300 is exposed by using the input of the data of the exposure pattern 400 including the main pattern 410 and the assistance pattern 420, and thereby the exposure region 310 of the photosensitive film 300 has the quadrangular shape including a pair of long edges A and a pair of short edges B, with curved surfaces at each corner.

FIG. 4 is a plan view of a photosensitive film pattern on a thin film according to an exemplary embodiment of the present invention.

As shown in FIG. 4, the exposed photosensitive film 300 is developed to form the photosensitive film pattern 330 on the thin film 210. The arrangement of the photosensitive film pattern 330 corresponds approximately to the arrangement of the exposure region 310 of the photosensitive film 300 shown in FIG. 3.

The photosensitive film pattern 330 has the quadrangular shape including a pair of long edges A and a pair of short edges B. Here, each corner of the photosensitive film pattern 330 may have a curved surface having a curvature, and the curvature radius of the curved surface may be 20% to 40% of the length of the short edge B.

This photosensitive film pattern 330 may decrease deterioration generated at the corner as compared with a photosensitive film pattern formed through an exposure apparatus using a conventional exposure pattern.

As described above, without using the mask, when forming the photosensitive film pattern 330 by using the exposure apparatus 100 including the photo-modulation element 120, the exposure pattern 400 including the main pattern 410 and the assistance pattern 420 is input to the photo-modulation element 120 to expose and develop the photosensitive film 300, thereby forming the photosensitive film pattern 330, which may decrease a defect generation.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a photosensitive film pattern, comprising:
    forming a thin film on a substrate;
    forming a photosensitive film on the thin film;
    arranging an exposure apparatus comprising a photo-modulation element on the photosensitive film;
    exposing the photosensitive film according to an exposure pattern of the photo-modulation element by using the exposure apparatus; and
    developing the exposed photosensitive film to form the photosensitive film pattern, wherein the exposure pattern comprises a main pattern comprising a quadrangular shape and a long edge and a short edge, and a first assistance pattern positioned at a first corner of the main pattern.

2. A method for manufacturing a photosensitive film pattern, comprising:
forming a thin film on a substrate;
forming a photosensitive film on the thin film;
arranging an exposure apparatus comprising a photo-modulation element on the photosensitive film;
exposing the photosensitive film according to an exposure pattern of the photo-modulation element by using the exposure apparatus; and
developing the exposed photosensitive film to form the photosensitive film pattern,
wherein the exposure pattern comprises a main pattern comprising a quadrangular shape and a long edge and a short edge, and a first assistance pattern positioned at a first corner of the main pattern,
wherein the assistance pattern has a square shape, and a length of a first edge of the assistance pattern is 20% to 30% of a length of the short edge of the main pattern.

3. The method of claim 2, wherein
the assistance pattern overlaps the long edge of the main pattern by 10% to 20% of a length of the short edge of the main pattern at the first corner of the main pattern.

4. The method of claim 2, wherein
the assistance pattern overlaps the short edge of the main pattern by 10% to 20% of a length of the short edge of the main pattern at the first corner of the main pattern.

5. The method of claim 2, wherein
the photosensitive film pattern has a quadrangular shape and comprises a long edge and a short edge, and
a first corner of the photosensitive film pattern comprises a curved surface having a curvature radius of 20% to 40% of a length of the short edge of the photosensitive film pattern.

6. The method of claim 1, wherein
the thin film is an insulating layer or a metal layer arranged on a substrate.

7. The method of claim 1, further comprising:
inputting data for the exposure pattern to the photo-modulation element.

* * * * *